United States Patent
Kang

(10) Patent No.: US 8,194,482 B2
(45) Date of Patent: Jun. 5, 2012

(54) TEST CIRCUIT, SEMICONDUCTOR MEMORY APPARATUS USING THE SAME, AND TEST METHOD OF THE SEMICONDUCTOR MEMORY APPARATUS

(75) Inventor: Yong Gu Kang, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 204 days.

(21) Appl. No.: 12/650,727

(22) Filed: Dec. 31, 2009

(65) Prior Publication Data

US 2011/0128804 A1 Jun. 2, 2011

(30) Foreign Application Priority Data

Sep. 30, 2009 (KR) .................. 10-2009-0093611

(51) Int. Cl.
*G11C 7/00* (2006.01)
(52) U.S. Cl. ...................................................... 365/201
(58) Field of Classification Search .................. 365/201
See application file for complete search history.

(56) References Cited

U.S. PATENT DOCUMENTS

| 5,189,316 | A | 2/1993 | Murakami et al. |
| 6,025,707 | A | 2/2000 | Joo |
| 6,130,829 | A | 10/2000 | Shin |
| 6,144,597 | A * | 11/2000 | Kim .............................. 365/201 |
| 7,046,576 | B2 | 5/2006 | Kim et al. |
| 2002/0167859 | A1* | 11/2002 | Chun ........................... 365/233 |
| 2006/0140019 | A1 | 6/2006 | Lee |

FOREIGN PATENT DOCUMENTS

| JP | 09-106676 | 4/1997 |
| JP | 09-106698 | 4/1997 |
| JP | 2005-071582 | 3/2005 |
| KR | 1020060082942 A | 7/2006 |
| KR | 1020070044697 A | 4/2007 |

* cited by examiner

*Primary Examiner* — Hoai V Ho
*Assistant Examiner* — Anthan Tran
(74) *Attorney, Agent, or Firm* — William Park & Associates Ltd.

(57) ABSTRACT

A test circuit of a semiconductor memory apparatus includes: a test control signal generating unit configured to enable a control signal if an active signal is enabled after a test signal is enabled, and substantially maintain the control signal in an enable state until a precharge timing signal is enabled; and a precharge control unit configured to invert the control signal to output the inverted signal as a bit line precharge signal when a preliminary bit line precharge signal is in a disable state.

16 Claims, 3 Drawing Sheets

TEST CIRCUIT, SEMICONDUCTOR MEMORY APPARATUS USING THE SAME, AND TEST METHOD OF THE SEMICONDUCTOR MEMORY APPARATUS

CROSS-REFERENCE TO RELATED APPLICATION

The present application claims priority under 35 U.S.C. §119(a) to Korean application number 10-2009-0093611, filed on Sep. 30, 2009, which is incorporated by reference in its entirety as if set forth in full.

BACKGROUND OF THE INVENTION

1. Technical Field

Various embodiments of the present disclosure generally relate to a semiconductor integrated circuit, and more particularly, to a test circuit, a semiconductor memory apparatus using the same, and a test method of the semiconductor memory apparatus.

2. Related Art

To improve reliability of a semiconductor memory apparatus, a test is generally performed to determine whether or not leakage current occurs between a word line and a bit line. This test is referred to as an Unlimited Sensing Delay (USD) test, in which the occurrence of leakage current between the word line and the bit line serves as a criterion on how long data stored in a memory cell will be retained.

FIG. 1 is a diagram schematically showing a configuration of a typical semiconductor memory apparatus having an open bit line structure. In FIG. 1, the bit line is represented as BL.

In a typical USD test, a logic low data is inputted to all mats of the semiconductor memory apparatus, e.g., first to fourth mats MAT0 to MAT3 in FIG. 1. Afterwards, the first to fourth mats MAT0 to MAT3 are enabled for a predetermined time, and the data stored in each of the first to fourth mats MAT0 to MAT3 is outputted after the predetermined time elapses. When a logic low data is outputted from the each of the first to fourth mats MAT0 to MAT3, this indicates that a micro-bridge (i.e., the leakage current flowing from the word line to the bit line) does not exist, whereas, if a logic high data is outputted from any one of the first to fourth mats MAT0 to MAT3, this indicates that a micro-bridge exists.

Since such a USD test is used to improve the reliability of the semiconductor memory apparatus, the test should be performed on all of the mats of the semiconductor memory apparatus under substantially the same condition. In the typical open bit line structure shown in FIG. 1, during the USD test, upper bit lines of a foremost mat (i.e., the first mat MAT0) are precharged to a bit line precharge voltage (VBLP) level and subsequently their voltage levels are not varied with time, whereas, when all of the mats are enabled, second to fourth mats MAT1 to MAT3 can have a high level bit line and a low level bit line by sense amplification operations of corresponding sense amplifier groups SA0 to SA3, respectively coupled thereto. Therefore, when the USD test is performed on the semiconductor memory apparatus having the open bit line structure, the USD test cannot be performed on all of the mats under substantially the same condition, thereby decreasing the reliability of the USD test.

SUMMARY OF THE INVENTION

Various aspects of the present invention comprise a test circuit capable of providing substantially the same condition to all enabled mats of a semiconductor memory apparatus having an open bit line structure when a USD test is performed on the semiconductor memory apparatus, the semiconductor memory apparatus using the same, and a test method of the semiconductor memory apparatus are disclosed herein.

In one aspect of the present invention, a test circuit of a semiconductor memory apparatus comprises: a test control signal generating unit configured to enable a control signal if an active signal is enabled after a test signal is enabled, and substantially maintain the control signal in the enable state until a precharge timing signal is enabled; and a precharge control unit configured to invert the control signal to output the inverted signal as a bit line precharge signal when a preliminary bit line precharge signal is in a disable state.

In another aspect of the present invention, a semiconductor memory apparatus comprises: a first sense amplifier group configured to have an open bit line structure and be commonly coupled to a first mat and a second mat; a second sense amplifier group configured to have an open bit line structure and be commonly coupled to the second mat and a third mat; a first test unit configured to precharge the first sense amplifier group if an active signal is enabled after a first test signal is enabled, and substantially maintain the first sense amplifier group in the precharge state until a precharge timing signal is enabled; and a second test unit configured to precharge the second sense amplifier group if the active signal is enabled after a second test signal is enabled, and substantially maintain the second sense amplifier group in the precharge state until the precharge timing signal is enabled.

In still another aspect of the present invention, a test method of a semiconductor memory apparatus comprises: a) storing data of a specific voltage level in a plurality of mats of a semiconductor memory apparatus having an open bit line structure and enabling the plurality of mats; b) precharging either one of an even-numbered or odd-numbered sense amplifier group and substantially maintaining the precharge state; and c) enabling the other sense amplifier group which is not precharged in the step b) and outputting the stored data.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
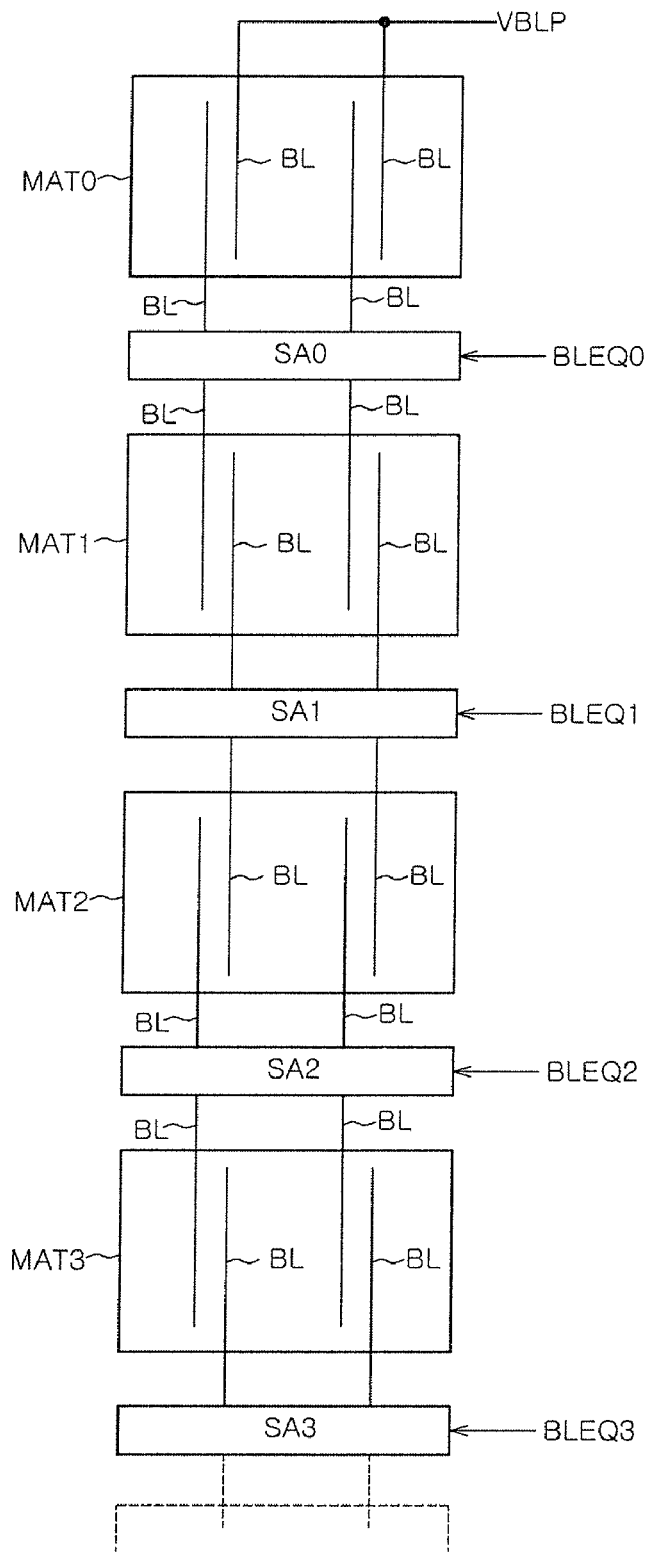
FIG. 1 is a diagram schematically showing a configuration of a typical semiconductor memory apparatus having an open bit line structure.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
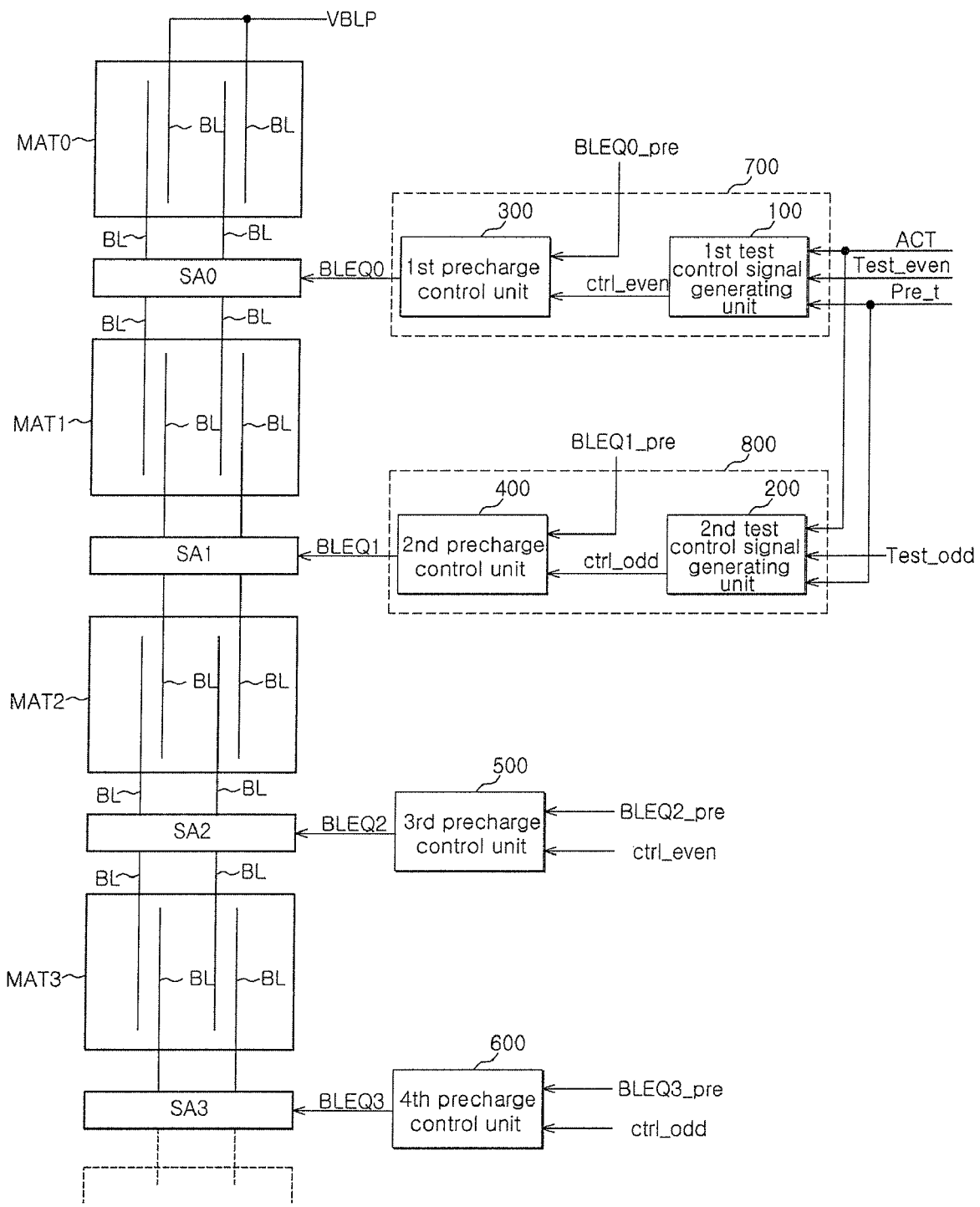
FIG. 2 is a diagram schematically showing a configuration of a semiconductor memory apparatus having an open bit line structure, according to one embodiment of the invention.

FIG. 2 is a diagram schematically showing a configuration of a semiconductor memory apparatus having an open bit line structure, according to one aspect of the invention. As shown in FIG. 2, the semiconductor memory apparatus comprises first to fourth mats MAT0 to MAT3, first to fourth sense amplifier groups SA0 to SA3, first and second test control signal generating units 100 and 200, and first to fourth precharge control units 300 to 600.

The first sense amplifier group SA0 is commonly coupled to the first and second mats MAT0 and MAT1, and may be interposed therebetween. The second sense amplifier group SA1 is commonly coupled to the second and third mats MAT1 and MAT2, and may be interposed therebetween. The third sense amplifier group SA2 is commonly coupled to the third and fourth mats MAT2 and MAT3, and may be interposed therebetween. The fourth sense amplifier group SA3 is commonly coupled to the fourth mat MAT3 and a fifth mat (not shown), and may be interposed therebetween.

After a first test signal Test_even is enabled, if an active signal ACT is enabled, the first test control signal generating unit 100 enables a first control signal ctrl_even and substantially maintains the first control signal ctrl_even in an enable state until a precharge timing signal Pre_t is enabled. Similarly, after a second test signal Test_odd is enabled, if the active signal ACT is enabled, the second test control signal generating unit 200 enables a second control signal ctrl_odd and substantially maintains the second control signal ctrl_odd in the enable state until the precharge timing signal Pre_t is enabled. During the USD test, the first test signal Test_even and the second test signal Test_odd may be inputted via a pad such that respective enable intervals thereof do not overlap with each other. During the USD test, the precharge timing signal Pre_t may also be inputted via the pad, and is enabled when a predetermined time required for the USD test elapses after the first test signal Test_even and the second test signal Test_odd are respectively enabled.

The first precharge control unit 300 generates a first bit line precharge signal BLEQ0 in response to the first control signal ctrl_even, if a first preliminary bit line precharge signal BLEQ0_pre is disabled. On the other hand, the first precharge control unit 300 generates the first bit line precharge signal BLEQ0 in response to the first preliminary bit line precharge signal BLEQ0_pre if the first control signal ctrl_even is disabled. At this time, if the first bit line precharge signal BLEQ0 is enabled, the first sense amplifier group SA0 is precharged, and all bit lines coupled to the precharged first sense amplifier group SA0 change to a bit line precharge voltage (VBLP) level.

The second precharge control unit 400 generates a second bit line precharge signal BLEQ1 in response to the second control signal ctrl_odd if a second preliminary bit line precharge signal BLEQ1_pre is disabled. On the other hand, the second precharge control unit 400 generates a second bit line precharge signal BLEQ1 in response to the second preliminary bit line precharge signal BLEQ1_pre if the second control signal ctrl_odd is disabled. At this time, if the second bit line precharge signal BLEQ1 is enabled, the second sense amplifier group SA1 is precharged, and all bit lines coupled to the precharged second sense amplifier group SA1 change to the bit line precharge voltage (VBLP) level.

The third precharge control unit 500 generates a third bit line precharge signal BLEQ2 in response to the first control signal ctrl_even if a third preliminary bit line precharge signal BLEQ2_pre is disabled. On the other hand, the third precharge control unit 500 generates a third bit line precharge signal BLEQ2 in response to the third preliminary bit line precharge signal BLEQ2_pre if the first control signal ctrl_even is disabled. At this time, if the third bit line precharge signal BLEQ2 is enabled, the third sense amplifier group SA2 is precharged, and all bit lines coupled to the precharged third sense amplifier group SA2 change to the bit line precharge voltage (VBLP) level.

The fourth precharge control unit 600 generates a fourth bit line precharge signal BLEQ3 in response to the second control signal ctrl_odd if a fourth preliminary bit line precharge signal BLEQ3_pre is disabled. On the other hand, the fourth precharge control unit 600 generates a fourth bit line precharge signal BLEQ3 in response to the fourth preliminary bit line precharge signal BLEQ3_pre if the second control signal ctrl_odd is disabled. At this time, if the fourth bit line precharge signal BLEQ3 is enabled, the fourth sense amplifier group SA3 is precharged, and all bit lines coupled to the precharged fourth sense amplifier group SA3 change to the bit line precharge voltage (VBLP) level.

The first to fourth preliminary bit line precharge signals BLEQ0_pre to BLEQ3_pre in FIG. 2 may be substantially the same as the first to fourth bit line precharge signals BLEQ0 to BLEQ3 in FIG. 1, respectively, and the first to fourth bit line precharge signals BLEQ0 to BLEQ3 in FIG. 2 may be respectively inputted to terminals of the corresponding first to fourth sense amplifier groups SA0 to SA3 in substantially the same manner as the first to fourth bit line precharge signals BLEQ0 to BLEQ3 are respectively inputted in FIG. 1. In addition, one circuit unit comprising the first test control signal generating unit 100 and the first precharge control unit 300 may be referred to as a first test unit 700, and another circuit unit comprising the second test control signal generating unit 200 and the second precharge control unit 400 may be referred to as a second test unit 800.

The first and second test control signal generating units 100 and 200 may have a substantially same configuration except for an input signal and an output signal. Therefore, only the configuration of the first test control signal generating unit 100 is described, and a description on the configuration of the second test control signal generating unit 200 is omitted.

Figure 3:
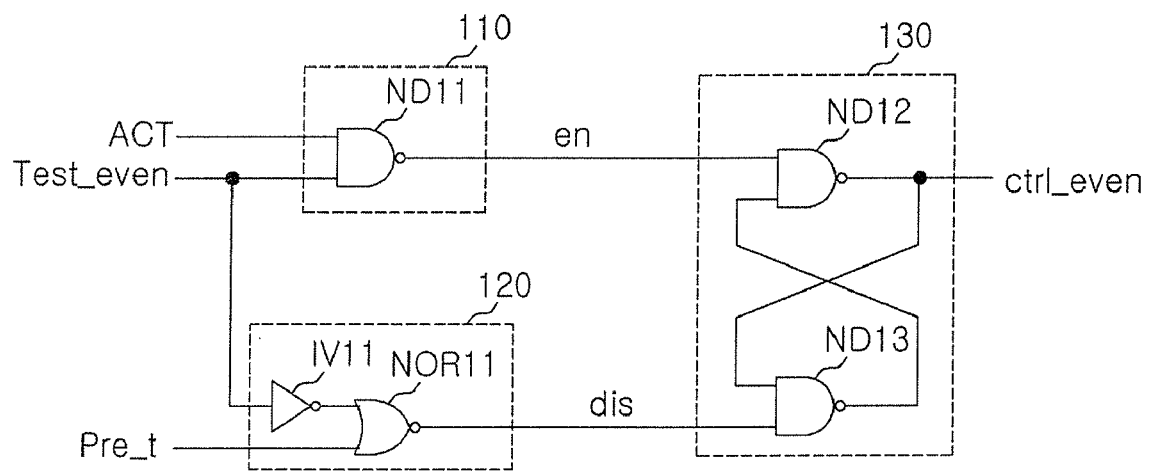
FIG. 3 is a diagram showing a configuration of a first test control signal generating unit of FIG. 2.

FIG. 3 is a diagram showing a configuration of the first test control signal generating unit 100 shown in FIG. 2 according to one aspect of the invention. As shown in FIG. 3, the first test control signal generating unit 100 comprises an enable unit 110, a disable unit 120, and a flip-flop 130.

The enable unit 110 enables an enable signal en to a logic low level only when the active signal ACT and the first test signal Test_even are both enabled to a logic high level.

The enable unit 110 comprises a first NAND gate ND11. The first NAND gate ND11 receives the active signal ACT and the first test signal Test_even to output the enable signal en.

The disable unit 120 enables a disable signal dis to a logic low level when the first test signal Test_even and the precharge timing signal Pre_t are both enabled to a logic high level.

The disable unit 120 comprises a first inverter IV11 and a NOR gate NOR11. The first inverter IV11 receives the first test signal Test_even. The NOR gate NOR11 receives an output signal of the first inverter IV11 and the precharge timing signal Pre_t to output the disable signal dis.

In a state where the disable signal dis is disabled at a logic high level, if the enable signal en is enabled to the logic low level, the flip-flop 130 enables the first control signal ctrl_even to a logic high level, and substantially maintains the first control signal ctrl_even in the enable state until the disable signal dis is enabled to the logic low level. Afterwards, if the disable signal dis is enabled to the logic low level, the flip-flop 130 disables the first control signal ctrl_even to a logic low level.

The flip-flop 130 comprises second and third NAND gates ND12 and ND13. The second NAND gate ND12 receives the enable signal en and an output signal of the third NAND gate ND13 to output the first control signal ctrl_even. The third NAND gate ND13 receives the disable signal dis and an output signal of the second NAND gate ND12.

The first to fourth precharge control units 300 to 600 may have a substantially same configuration except for an input signal and an output signal. Therefore, only the configuration of the first precharge control unit 300 is described, and a description on the configurations of the second to fourth precharge control units 400 to 600 is omitted.

Figure 4:
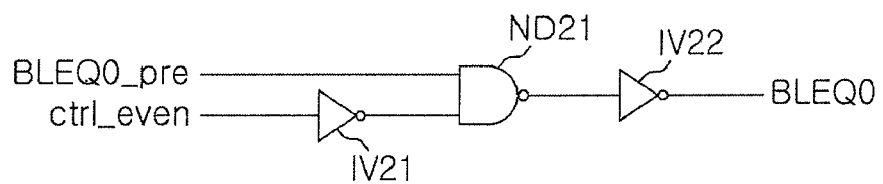
FIG. 4 is a diagram showing a configuration of a first precharge control unit shown in FIG. 2.

Referring to FIG. 4, if the first preliminary bit line precharge signal BLEQ0_pre is disabled to a logic high level, the first precharge control unit 300 inverts the first control signal ctrl_even to output the inverted signal as the first bit line precharge signal BLEQ0. On the other hand, if the first control signal ctrl_even is disabled to a logic low level, the first precharge control unit 300 outputs the first preliminary bit line precharge signal BLEQ0_pre as the first bit line precharge signal BLEQ0. Herein, the first bit line precharge signal BLEQ0 is preferably a low enable signal.

The first precharge control unit 300 comprises second and third inverters IV21 and IV22 and a fourth NAND gate ND21. The second inverter IV21 receives the first control signal ctrl_even. The fourth NAND gate ND21 receives an output signal of the second inverter IV21 and the first preliminary bit line precharge signal BLEQ0_pre. The third inverter IV22 inverts an output signal of the fourth NAND gate ND21 to output the inverted signal as the first bit line precharge signal BLEQ0.

In such a configuration, the semiconductor memory apparatus according to one aspect of the invention may operate as follows.

Referring back to FIG. 2, in a state where the first test signal Test_even is enabled, if the active signal ACT is enabled, the first test control signal generating unit 100 enables the first control signal ctrl_even, and substantially maintains the first control signal ctrl_even in the enable state until the precharge timing signal Pre_t is enabled, and then disables the first control signal ctrl_even if the precharge timing signal Pre_t is enabled.

Similarly, in a state where the second test signal Test_odd is enabled, if the active signal ACT is enabled, the second test control signal generating unit 200 enables the second control signal ctrl_odd, and substantially maintains the second control signal ctrl_odd in the enable state until the precharge timing signal Pre_t is enabled, and then disables the second control signal ctrl_odd if the precharge timing signal Pre_t is enabled.

The first precharge control unit 300 inverts the first control signal ctrl_even to output the inverted signal as the first bit line precharge signal BLEQ0, if the first preliminary bit line precharge signal BLEQ0_pre is disabled. On the other hand, the first precharge control unit 300 outputs the first preliminary bit line precharge signal BLEQ0_pre as the first bit line precharge signal BLEQ0 if the first control signal ctrl_even is disabled.

The second precharge control unit 400 inverts the second control signal ctrl_odd to output the inverted signal as the second bit line precharge signal BLEQ1, if the second preliminary bit line precharge signal BLEQ1_pre is disabled. On the other hand, the second precharge control unit 400 outputs the second preliminary bit line precharge signal BLEQ1_pre as the second bit line precharge signal BLEQ1 if the second control signal ctrl_odd is disabled.

The third precharge control unit 500 inverts the first control signal ctrl_even to output the inverted signal as the third bit line precharge signal BLEQ2, if the third preliminary bit line precharge signal BLEQ2_pre is disabled. On the other hand, the third precharge control unit 500 outputs the third preliminary bit line precharge signal BLEQ2_pre as the third bit line precharge signal BLEQ2 if the first control signal ctrl_even is disabled.

The fourth precharge control unit 600 inverts the second control signal ctrl_odd to output the inverted signal as the fourth bit line precharge signal BLEQ3, if the fourth preliminary bit line precharge signal BLEQ3_pre is disabled. On the other hand, the fourth precharge control unit 600 outputs the fourth preliminary bit line precharge signal BLEQ3_pre as the fourth bit line precharge signal BLEQ3 if the second control signal ctrl_odd is disabled.

The first to fourth sense amplifier groups SA0 to SA3 may perform the precharge operation in response to the first to fourth bit line precharge signals BLEQ0 to BLEQ3, respectively.

A test method of the semiconductor memory apparatus is described below using an example.

Initially, a logic low data is stored in all of the first to fourth mats MAT0 to MAT3. The first test signal Test_even of the first and second test signals Test_even and Test_odd is enabled, then the active signal ACT is enabled thus enabling the first control signal ctrl_even. Then, since the active signal ACT is in the enable state, the first to fourth mats MAT0 to MAT3 are all enabled, and the first to fourth preliminary bit line precharge signals BLEQ0_pre to BLEQ3_pre are all disabled. In addition, since the first control signal ctrl_even is enabled and the first and third preliminary bit line precharge signals BLEQ0_pre and BLEQ2_pre are both disabled, the first and third bit line precharge signals BLEQ0 and BLEQ2 are both enabled. On the other hand, if the second control signal ctrl_odd and the second and fourth preliminary bit line precharge signals BLEQ1_pre and BLEQ3_pre are all disabled, the second and fourth bit line precharge signals BLEQ1 and BLEQ3 are both disabled.

The first and third sense amplifier groups SA0 and SA2, respectively configured to receive the first and third bit line precharge signals BLEQ0 and BLEQ2, are substantially maintained in a precharge state, whereas the second and fourth sense amplifier groups SA1 and SA3, respectively configured to receive the second and fourth bit line precharge signals BLEQ1 and BLEQ3, sense and amplify logic low data. That is, all bit lines coupled to the respective first and third sense amplifier groups SA0 and SA2 are substantially maintained at the bit line precharge voltage (VBLP) level.

After a predetermined time elapses, the precharge timing signal Pre_t is enabled and thereby the first control signal ctrl_even is disabled. Then, since the first control signal ctrl_even is disabled, the first and third bit line precharge signals BLEQ0 and BLEQ2 are both disabled.

After the precharge timing signal Pre_t is enabled, a read command is inputted to the semiconductor memory apparatus and thus the data stored in the respective second and fourth mats MAT1 and MAT3 are respectively outputted through bit lines respectively coupled to the second and fourth sense amplifier groups SA1 and SA3, both of which are not in the precharge state.

Referring to FIG. 2, since the first and third sense amplifier groups SA0 and SA2 respectively coupled to the second and fourth mats MAT1 and MAT3 are both precharged during the USD test, i.e., since upper bit lines of the respective second and fourth mats MAT1 and MAT3 are substantially maintained at the bit line precharge voltage (VBLP) level, the USD test can be performed on the second and fourth mats MAT1 and MAT3 under substantially the same condition as that of the first mat MAT0.

In addition, if the second test signal Test_odd is enabled and subsequently the USD test is performed in the above-described way, the USD test can also be performed on the third mat MAT2 under substantially the same condition as that of the first mat MAT0.

Consequently, the test method according to one aspect of the invention selectively precharges an even-numbered sense amplifier group or an odd-numbered sense amplifier group during the USD test, thereby improving the reliability of the USD test.

As a result, the test circuit of the semiconductor memory apparatus according to one aspect of the invention can substantially maintain upper bit lines of mats, which are not continuously coupled with each other, at the bit line precharge voltage level during the USD test, thereby improving the reliability of the test on the semiconductor memory apparatus having the open bit line structure.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A test circuit of a semiconductor memory apparatus comprising:
    a test control signal generating unit configured to enable a control signal if an active signal is enabled after a test signal is enabled and substantially maintain the control signal in an enable state until a precharge timing signal is enabled; and
    a precharge control unit configured to invert the control signal to output an inverted signal as a bit line precharge signal when a preliminary bit line precharge signal is in a disable state.

2. The test circuit of claim 1, wherein the test control signal generating unit is configured to disable the control signal at a time when the precharge timing signal is enabled.

3. The test circuit of claim 1, wherein the test control signal generating unit comprises:
    an enable unit configured to enable an enable signal only when the test signal and the active signal are both enabled;
    a disable unit configured to enable a disable signal when the test signal and the precharge timing signal are both enabled; and
    a flip-flop configured to enable the control signal if the enable signal is enabled and substantially maintain the control signal in the enable state until the disable signal is enabled.

4. The test circuit of claim 1, wherein the precharge control unit is configured to output the preliminary bit line precharge signal as a bit line precharge signal when the control signal is in a disable state.

5. The test circuit of claim 1, wherein the bit line precharge signal comprises a signal which is precharged to a bit line precharge voltage level, and inputted to a sense amplifier having an open bit line structure.

6. A semiconductor memory apparatus comprising:
    a first sense amplifier group configured to have an open bit line structure and be commonly coupled to a first mat and a second mat;
    a second sense amplifier group configured to have the open bit line structure and be commonly coupled to the second mat and a third mat;
    a first test unit configured to precharge the first sense amplifier group if an active signal is enabled after a first test signal is enabled, and substantially maintain the first sense amplifier in a precharge state until a precharge timing signal is enabled; and
    a second test unit configured to precharge the second sense amplifier group if the active signal is enabled after a second test signal is enabled, and substantially maintain the second sense amplifier group in the precharge state until the precharge timing signal is enabled.

7. The semiconductor memory apparatus of claim 6, wherein the first sense amplifier group is configured to be precharged in response to a bit line precharge signal.

8. The semiconductor memory apparatus of claim 7, wherein the first test unit comprises:
    a test control signal generating unit configured to enable a control signal if the active signal is enabled after the first test signal is enabled, and substantially maintain the control signal in the enable state until the precharge timing signal is enabled; and
    a precharge control unit configured to invert the control signal to output an inverted signal as the bit line precharge signal when a preliminary bit line precharge signal is in a disable state.

9. The semiconductor memory apparatus of claim 8, wherein the test control signal generating unit is configured to disable the control signal at a time when the precharge timing signal is enabled.

10. The semiconductor memory apparatus of claim wherein the test control signal generating unit comprises:
    an enable unit configured to enable an enable signal when the first test signal and the active signal are both enabled;
    a disable unit configured to enable a disable signal when the first test signal and the precharge timing signal are both enabled; and
    a flip-flop configured to enable the control signal if the enable signal is enabled, and substantially maintain the control signal in the enable state until the disable signal is enabled.

11. The semiconductor memory apparatus of claim 8, wherein the precharge control unit is configured to output the preliminary bit line precharge signal as the bit line precharge signal when the control signal is in the disable state.

12. The semiconductor memory apparatus of claim 6, wherein the second sense amplifier group is configured to be precharged in response to a bit line precharge signal.

13. The semiconductor memory apparatus of claim 12, wherein the second test unit comprises:
    a test control signal generating unit configured to enable a control signal if the active signal is enabled after the second test signal is enabled, and substantially maintain the control signal in the enable state until the precharge timing signal is enabled; and
    a precharge control unit configured to invert the control signal to output an inverted signal as the bit line precharge signal when a preliminary bit line precharge signal is in a disable state.

14. The semiconductor memory apparatus of claim 13, wherein the test control signal generating unit is configured to disable the control signal at a time when the precharge timing signal is enabled.

15. The semiconductor memory apparatus of claim 14, wherein the test control signal generating unit comprises:
   an enable unit configured to enable an enable signal only when the second test signal and the active signal are both enabled;
   a disable unit configured to enable a disable signal when the second test signal and the precharge timing signal are both enabled; and
   a flip-flop configured to enable the control signal if the enable signal is enabled, and substantially maintain the control signal in an enable state until the disable signal is enabled.

16. The semiconductor memory apparatus of claim 13, wherein the precharge control unit is configured to output the preliminary bit line precharge signal as the bit line precharge signal when the control signal is in the disable state.

* * * * *